United States Patent
Fukahori

(10) Patent No.: US 6,178,538 B1
(45) Date of Patent: Jan. 23, 2001

(54) INTERLEAVED ANALOG METRIC CALCULATOR

(75) Inventor: Kiyoshi Fukahori, Tokyo (JP)

(73) Assignee: Texas Instruments, Incoporated, Dalllas, TX (US)

(*) Notice: Under 35 U.S.C. 154(b), the term of this patent shall be extended for 0 days.

(21) Appl. No.: 09/021,766

(22) Filed: Feb. 11, 1998

(51) Int. Cl.[7] ............................................. H03M 13/41
(52) U.S. Cl. ................................... 714/795; 714/796
(58) Field of Search .............................. 714/794, 795, 714/796, 769

(56) References Cited

U.S. PATENT DOCUMENTS

| | | | |
|---|---|---|---|
| 4,087,787 | * | 5/1978 | Acampora .................. 340/146.1 AQ |
| 5,384,560 | * | 1/1995 | Yamasaki ......................... 340/146.2 |
| 5,430,768 | * | 7/1995 | Minuhin et al. ...................... 375/340 |
| 5,448,583 | * | 9/1995 | Miyamoto et al. ..................... 371/43 |
| 5,734,680 | * | 3/1998 | Moore et al. ......................... 375/263 |
| 5,768,320 | * | 6/1998 | Kovacs et al. ........................ 375/341 |
| 5,844,741 | * | 12/1998 | Yamakawa et al. ................... 360/65 |
| 5,917,859 | * | 6/1999 | Yamasaki et al. .................... 375/262 |
| 5,933,463 | * | 8/1999 | Choi ..................................... 375/341 |

OTHER PUBLICATIONS

Fukahori et al., "An Analog EPR4 Viterbi Detector in Read Channel IC for Magnetic Hard Disks", ISSCC98 Digest of Technical Papaers, pp. 380–381, Dec. 1998.*

* cited by examiner

Primary Examiner—Stephen Baker
(74) Attorney, Agent, or Firm—W. Daniels Swayze, Jr.; W. James Brady, III; Frederick J. Telecky, Jr.

(57) ABSTRACT

A metric calculator is disclosed having an interleaved structure for increasing the time during which metrics can be calculated by circuit components. A first interleave samples voltage of the received signal during a first phase and a second interleave samples voltage of the received signal during an opposite phase. The interleaved architecture calculates and updates metrics and decisions based on these metrics at code rate, without requiring completion of all ACS computations in one code period.

17 Claims, 7 Drawing Sheets

COMPUTE
PATH METRICS:
1 → 3 → 6
5 → 3 → 6
3 → 7 → 6
7 → 7 → 6

INTERLEAVED ANALOG METRIC CALCULATOR

BACKGROUND OF THE PRESENT INVENTION

1. Field of the Invention

The present invention relates to the field of digital transmission through analog channels and, more particularly, to a method and apparatus for calculating metrics in a maximum likelihood detector for decoding a sequence of signals received through analog channels.

2. Background Art

Communication of voice and data signals is often accomplished by converting analog signals to digital signals. These digital signals are then transmitted from a transmitting device to a receiving device, converted back to analog signals, if necessary, and subsequently communicated to a user. This type of digital transmission is often performed through analog transmission channels. Digital information through this analog channel is transmitted in the form of "symbols" representing digital values. In some cases, adjacent symbols can overlap, resulting in a phenomenon known as intersymbol interference. This interference may corrupt a digital transmission, leading to errors in the receipt of the digital information.

These types of errors in transmission of digital information occur in many instances, including in magnetic recording channels. Such channels may suffer from intersymbol interference as well as noise present during transmission, and therefore require a method for decoding the binary symbol sequences that they output in a possibly corrupted form. Those skilled in the art are familiar with a decoding technique called maximum likelihood sequence estimation (MLSE), which is an effective tool used in conjunction with pulse detectors for receiving and decoding digital transmissions that suffer from intersymbol interference and noise. Maximum likelihood detection is especially useful with partial response signaling, for example class IV partial response signaling, in which the ideal response of a magnetic recording channel is modeled. Using the idealized response, and accounting for the effects of noise, maximum likelihood detection retrospectively analyzes received signals and determines the most likely sequence of data transmitted through the magnetic recording channel.

Class IV partial response signaling is only one type of partial response signaling currently used. In a class IV partial response, or PR4 system, when a pulse indicating a single magnetization transition occurs, it will ideally result in an impulse equal to "1" at the transition location and another impulse at the next sample period. The second impulse is equivalent to a response given by the operator (1+D). PR4 is a particular case of a more general family of PR polynomials, given by the general equation: $(1-D)(1+D)^n$. PR4 corresponds to n=1. Another system, called EPR4, or "Enhanced Partial Response 4," is provided by setting n=2. In the EPR4 system, the impulse response caused by an isolated transition in a magnetic recording channel may be approximated by the term $(1+D)^2=1+2D+D^2$. When n=3, the impulse response is given by the polynomial $(1+D)^3=1+3D+3D^2+D^3$. This type of partial response is called $E^2PR4$. Because $E^2PR4$ is a higher order polynomial, it provides the closest fit to the magnetic channel frequency response, and is therefore a better predictor of the actual response of the magnetic channel. An embodiment of a metric calculator according to the present invention is disclosed with respect to the EPR4 system. However, it will be understood by those skilled in the art that the invention can also be applied to other systems, including PR4 and $E^2PR4$ systems.

Various implementations of maximum likelihood sequence estimation, in particular, the Viterbi algorithm, are well known in the art. Several of these implementations are discussed in U.S. Pat. No. 5,384,560, assigned to the assignee of the present application. A brief explanation of the EPR4 Viterbi detector is given here to facilitate the explanation of the present invention. A more complete explanation of the EPR4 Viterbi detector is provided in G. David Forney, Jr., "Maximum-Likelihood Sequence Estimation of Digital Sequences in the Presence of Intersymbol Interferences," IT-18 IEEE Transactions on Information Theory, 363 (May 1972), incorporated herein by reference.

The EPR4 Viterbi detector is a sequence detector for a signal channel whose response is characterized by the following EPR4 equation:

$$(1-D)(1+D)^2=(1-D)(1+2D+D^2),$$

where D is a delay operator representing one unit of delay or code period Tc. Using this equation, the Viterbi detector attempts to derive data that it computes to be most likely from a sequence of received signals.

The EPR4 channel is completely characterized by transitions associated with three binary bits: the current data bit ($I_k$), one bit just prior to it Ik-1, and another bit that is two code periods (2Tc) earlier Ik-2. It will be apparent to these skilled in the art that these three binary bits (Ik, Ik-1, Ik-2) fully describe one of the eight states in which the channel can be at time k. The EPR4 Viterbi detector assigns a measure of likelihood to all eight states at every code period, and derives data from the state that is determined to be most likely. As is known in the art, the value that is computed as a measure of likelihood is called a metric.

FIGS. 1(a)–1(d) are timelines illustrating a simple example of an EPR4 channel response. In the timeline shown in FIG. 1(a), the signal Iw represents a sequence of binary data input to the EPR4 channel. This signal can represent an input sequence 0011000, for example, after the data is processed in a read channel circuit and output as the current of a write flip flop circuit. At time k, the write current transitions from one to zero, or from high to low. In the ideal case where there is no noise, this transition generates an overall EPR4 response of $X_k=0$, shown at time=k in FIG. 1(d).

The timeline in FIG. 1(b) illustrates the (1−D) response to signal Iw, representing the differentiation process associated with the magnetic transition caused by the write current Iw onto the media.

The timeline in FIG. 1(c) is the PR4 response of the channel characterized by the multiplication of an additional (1+D) operator to the (1−D) differentiation signal. As can be seen from the figure, this is equivalent to time-shifting the (1−D) response by a unit delay, and adding the result to the (1−D) response. This function approximates the "spreading" of the magnetic transition of the FIG. 1(a) timeline over neighboring bit periods in a PR4 system.

Finally, the timeline in FIG. 1(d) shows the EPR4 response, which is obtained by further multiplying the PR4 response with yet another (1+D) operator. This response characterizes the response of the EPR4 channel for the signal shown in the FIG. 1(a) timeline. As can be seen from FIGS. 1(a) and 1(d), the ideal overall EPR4 response of $X_k$, in the absence of noise, for a transition from state "3" (011) to state "6" (011), at time k, is equal to zero.

FIGS. 2(a)–2(d) are timelines illustrating another simple example of an EPR4 channel response. In the timeline shown in FIG. 2(a), the signal Iw represents binary data input sequence of 0111000, outputted as current by the output of a flip flop in a read channel. As in FIG. 1(b), the timeline in FIG. 2(b) illustrates the (1−D) differentiation response to signal Iw. The timeline in FIG. 2(c) illustrates the PR4 response of the channel characterized by the multiplication of an additional (1+D) operator to the (1−D) differentiation signal. Finally, the timeline in FIG. 2(d) shows the EPR4 response for 0111000, obtained by further multiplying the PR4 response with another (1+D) operator.

As in FIG. 1(a), the timeline in FIG. 2(a) shows the write current transitioning from one to zero at time=k. However, the transition of the signal from state "7" or 111, to state "3" or 110, generates an ideal overall EPR4 response of $x_k=-1$, shown at time=k in FIG. 2(d).

The ideal characteristic responses of the EPR4 channel in these examples can be used to derive metric equations for the different states of the channel. With reference to FIGS. 1(a) and 1(d), for example, at time=k, with no noise present, the ideal response of the channel is $x_k=0$ and the channel is in state "6" or 110 in binary (with Ik-2, Ik-1 Ik=1,1,0). In the presence of noise, the response changes from $x_k$ to the actual response, $y_k$. We can determine the likelihood of the channel being in the state "6" at time (t)=k as follows. To come to the state "6"=110, the previous channel state ($I_{k-3}, I_{k-2}, I_{k-1}$) had to be either 011="3" or 111="7." Thus the metric calculator will limit itself to these two possibilities of what the previous channel could have been. This two-way decision approach is often called the "Radix 2" approach.

For the possibility that the previous channel state was "3," as shown in FIG. 1(a), the actual response is $y_k=x_k+n_k$, where $n_k$ represents noise present in the actual response $y_k$ sample. As discussed above and shown in FIG. 1(d), the ideal response $x_k$ is equal to zero for the transition from "3" to "6." Therefore, if the previous channel state was "3," the actual response $y_k=0+n_k=n_k$. However, if the previous channel state was "7," the response would be $y_k=-1+n_k$. This is shown in FIG. 2(d), where the ideal response, $x_k$, for the transition from previous state "7" to current state "6" is equal to −1.

To determine which of the two previous states, "3" or "7," is most likely the correct state, we determine which transition to "6" results in the smallest error from the ideal response of the EPR4 channel. To achieve this, we compute mean square errors for the two possible states, as follows:

For the case of a transition from "3" to "6" with $x_k=0$, the mean square error=$(y_k-x_k)^2=(y_k-0)^2=y_k^2$.

For the case of a transition from "7" to "6" with $x_k=-1$, the mean square error $(y_k-x_k)^2=(y_k-(-1))^2=y_k^2+2y_k+1$.

Since $y_k^2$ is common to both mean square errors, it can be eliminated from the metric calculations. The smallest mean square error is chosen, indicating the state most likely correct (i.e., the state most likely to have been the state previous to "6"). Therefore, in our example, if $2y_k+1$ is greater than zero, then the selected state will be "3," or 001, and the data bit three units prior in time will have been 0. If, however, $2y_k+1$ is less than zero, the selected state will be "7," or 111, and the data bit three units prior in time will have been 1. In the case where $2y_k+1$ is equal to zero, meaning the likelihood of previous states "3" and "7" is the same, the state "3" can be selected to permit calculations to proceed.

It is often easier in circuit implementations to compute a maximum value rather than a minimum value. Therefore, the equations above are normalized and simplified by dividing through by −2 and adding a constant term "0.5" to both equations. Thus, a metric value at time k is derived for state "6" as follows: $M_k(6)=\text{Max}\{M_{k-1}(3)+0.5, M_{k-1}(7)-y_k\}$. This equation states that the likelihood of state "6" at time k is assigned a value which is the larger of the previous metric associated with state "3" plus a constant term of "0.5," or of the previous metric associated with state "7" minus the received sample $y_k$. If the former is chosen then the decision $I_{k-3}$ is 0 since the previous state was 011="3". Otherwise, the decision is 1 from 111="7". Note that the decision made at k is for $I_{k-3}$ and has three code periods delay associated with it.

Similarly, for the remaining seven states after similar manipulations we have the following equations. The equation for state "6" given above is included for completeness:

$M_k(0)=\text{Max}\{M_{k-1}(0)+0.5, M_{k-1}(4)-y_k\}$, $M_k(1)=\text{Max}\{M_{k-1}(0)+y_k, M_{k-1}(4)+0.5\}$, $M_k(2)=\text{Max}\{M_{k-1}(1)+y_k, M_{k-1}(5)+0.5\}$, $M_k(3)=\text{Max}\{M_{k-1}(1)+2y_k-1.5, M_{k-1}(5)+y_k\}$, $M_k(4)=\text{Max}\{M_{k-1}(2)-y_k, M_{k-1}(6)-2y_k-1.5\}$, $M_k(5)=\text{Max}\{M_{k-1}(2)+0.5, M_{k-1}(6)-y_k\}$, $M_k(6)=\text{Max}\{M_{k-1}(3)+0.5, M_{k-1}(7)-y_k\}$, $M_k(7)=\text{Max}\{M_{k-1}(3)+y_k, M_{k-1}(7)+0.5\}$, The above computations, algebraically manipulating previous metrics to provide current values of metrics, are called ACS computations since they involve an Add, Compare and Select process. At the end of every code period, every state has a metric value, indicating the likelihood that the channel is in that state. In addition, every state has a sequence of decisions associated with itself. Eight sets of these data are then fed into a register called the "survival path register." This register performs the final selection of data, $I_{k-3}$, with some further delay that is dependent on the particulars of the survival path register implementation chosen. As will be recognized by those skilled in the art, the object of all survival path registers, whatever their implementation, is to pick the most likely sequence among the eight possible candidates.

FIG. 3 is a state transition diagram. As its name implies it simply shows the history of state transitions from one code period to the next. Such diagrams are often used to describe Viterbi path "merge." If the survival path register is sufficiently long, the path will tend to "merge," i.e., all eight decisions tend to be identical, making the particular state from which data is chosen unimportant. The particulars of survival path registers are not important and the implementation is always digital.

The prior art has most commonly implemented Viterbi detectors in the digital domain after A/D conversion. Such implementations may result in loss of performance, loss of achievable data rate, or both. A very straightforward analog approach would be to attempt the above-described ACS computations in one period, Tc. However, this approach does not lend itself to the data rate requirement of current HDDS.

To overcome the speed limitation of the one-step approach, another conceivable analog implementation would be to use a two-step approach illustrated in FIGS. 4(a) and 4(b). With this approach, ACS computations would be carried out in two code periods, or 2Tc. For example, as shown in FIG. 4(a), instead of determining path metrics for the transition in one code period from "3" to "6" and "7" to "6," as before, path metrics would be calculated for the transitions from "1" to "3" to "6," "5" to "3" to "6," "3" to "7" to "6" and "7" to "7" to "6." This approach necessarily increases speed at the expense of hardware complexity. Instead of making the two-way decision as described above, a four-way decision would be performed at every other code period (Radix 4). Using this approach, the metric update equations for state "i" become:

$$M_k(i)=\text{Max}\{M_{k-1}(j)+\text{etc.}, M_{k-1}(k)+\text{etc.}\}$$

$$=\text{Max}\{\text{Max}\{M_{k-2}(l)+\text{etc.}, M_{k-2}(m)+\text{etc.}\}, \text{Max}(M_{k-2}(n)+\text{etc.}, M_{k-2}(o)+\text{etc.}\}\}$$

$$=\text{Max}\{M_{k-2}(l)+\text{etc.}, M_{k-2}(m)+\text{etc.}, M_{k-2}(n)+\text{etc.}, M_{k-2}(o)+\text{etc.}\}.$$

Here states j and k are two possible states at time k-1 from which state "i" could have come. States l and m, and n and o, are four possible states at time k-2 from which states j and k respectively, could have come. For example, for "i "=6= 110, the metric equations become:

$$M_k(6)=\text{Max}\{M_{k-1}(3)+0.5, M_{k-1}(7)-y_k\}$$

$$=\text{Max}\{\text{Max}\{M_{k-2}(1)+2y_{k-1}-2.5, M_{k-2}(5)+y_{k-1}\}, \text{Max}\{M_{k-2}(3)+y_{k-1}, M_{k-2}(7)+0.5\}\}.$$

$$=\text{Max}\{M_{k-2}(1)+2y_{k-1}-2.5, M_{k-2}(5)+y_{k-1}, M_{k-2}(3)+y_{k-1}, M_{k-2}(7)+0.5\}.$$

Thus (j,k) are 3=011 and 7=111 and (l,m) and (n,o) are 001="1," 101="5," and 011="3," and 111="7." Associated decisions, $I_{k-4}$, $I_{k-3}$, are 00,10,01,11 for states "1," "5," "3" and "7," respectively.

Thus, the two step approach requires Additions involving two past samples, $y_k$, $y_{k-1}$, Comparisons of four metrics and Selections of the largest metric out of the four. FIG. 4(b) is a block diagram illustrating this two-step approach, and a timing diagram therefor. Two samples, $y_k$, and also $y_{k-1}$, are inputted to a detector such that four metrics are calculated and the largest metric, $M_k$, is stored by capacitors CHA and CHB alternately. The selection process of the largest metric also yields the decisions. The metric calculations must be done in two code periods, for example 10 nanoseconds in the example of FIG. 4(b). While this implementation would still present a workable approach, it is complex and the hardware required to realize it would be very costly, not only in terms of silicon area, but also in terms of matching of components needed to achieve near-ideal performance.

SUMMARY OF THE INVENTION

To overcome the limitations of the related art discussed above, and to achieve further advantages that will become apparent in the foregoing description, the present invention provides a metric calculator that can be implemented using analog components. Using the interleaved architecture disclosed herein, the invention computes and updates metrics, and derives decisions based on these computations at code rate, but by two sets of identical circuits. The first set of circuits compute metrics during one phase of the signal clock, while the second set compute metrics during the second phase of the signal clock. By sharing the computations in this fashion, the metric calculator permits all metric updates and decisions to be generated at code rate, without requiring that all ACS computations be done in one code period. Instead, the interleaved architecture allows ACS computations to be performed effectively in two code periods.

In this analog implementation, two track and hold (T/H) circuits are used to sample input signals at opposite clock phases. These voltages are converted by voltage-to-current samplers into current signals that are in turn provided to the interleaved metric calculators at every code rate. Each interleave uses a maximum circuit and a track and hold circuit, and in conjunction with the other interleave calculates metrics. Specifically, an interleave that has begun the metric computation immediately provides it to the other interleave that has just begun the sampling process of an input signal so that the latter circuit can begin an Add/Compare/Select function before the former has fully acquired the accurate metric.

The present invention will be more fully understood by those of ordinary skill in the art upon consideration of the following detailed description of a preferred embodiment of the present invention, together with the accompanying drawings, in which like reference numerals refer to like elements.

DETAILED DESCRIPTION OF THE PREFERRED EMBODIMENT

A presently preferred embodiment of the invention will now be explained in terms of the aforedescribed drawings and the following description.

Figure 1:
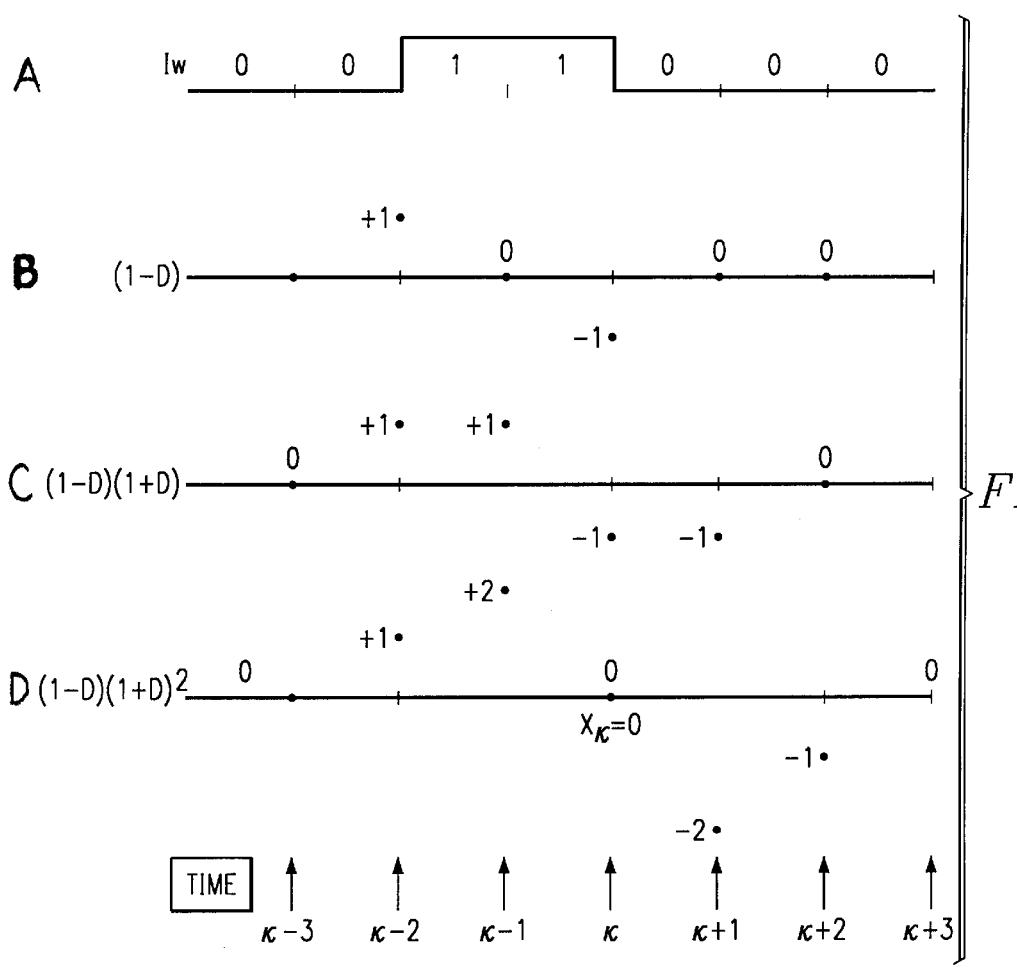
FIGS. 1(a)–1(d) illustrate a simple example of an EPR4 channel response to an input signal.
Figure 2:
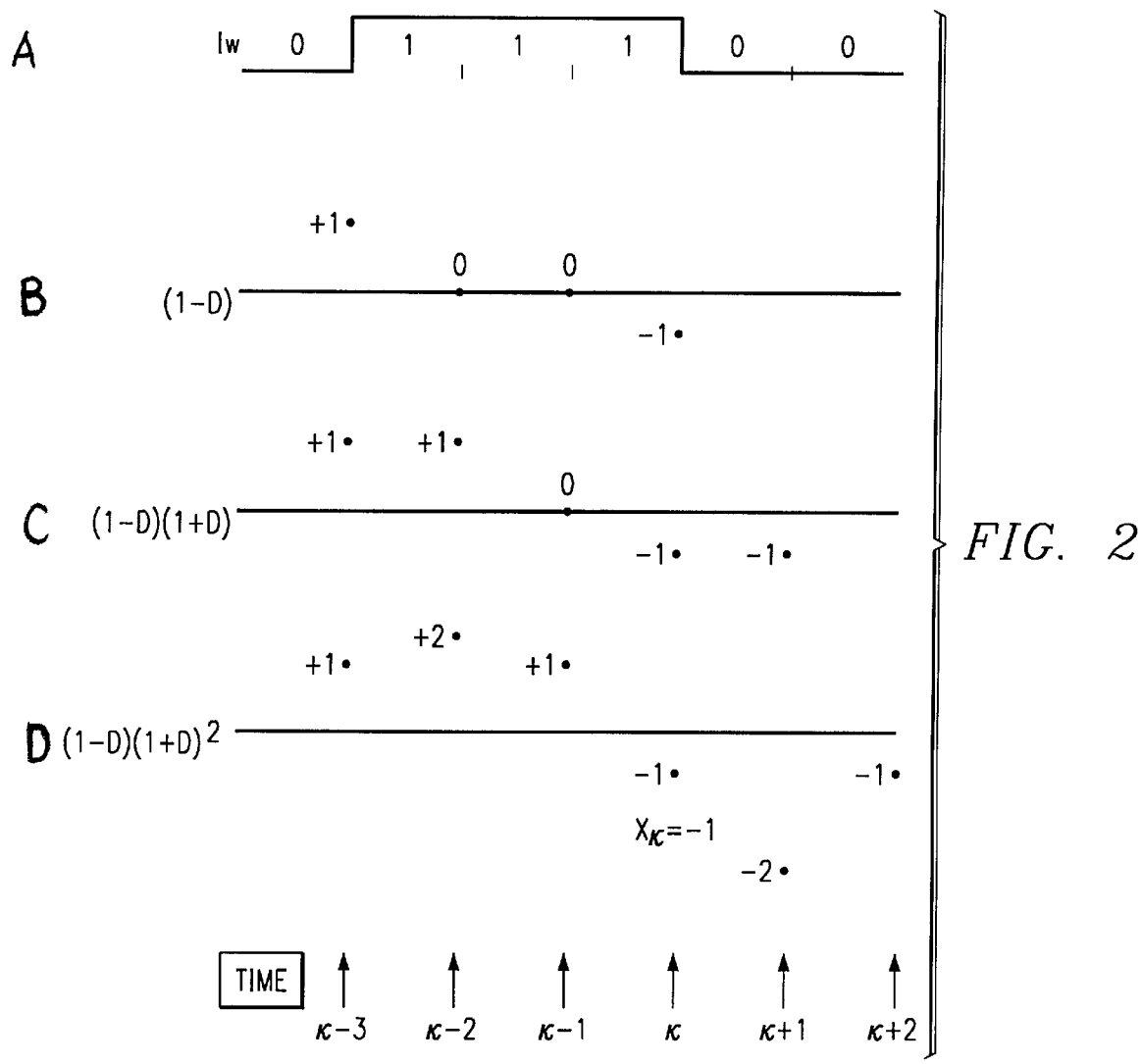
FIGS. 2(a)–2(d) illustrate another example of an EPR4 channel response to a different input signal.
Figure 3:
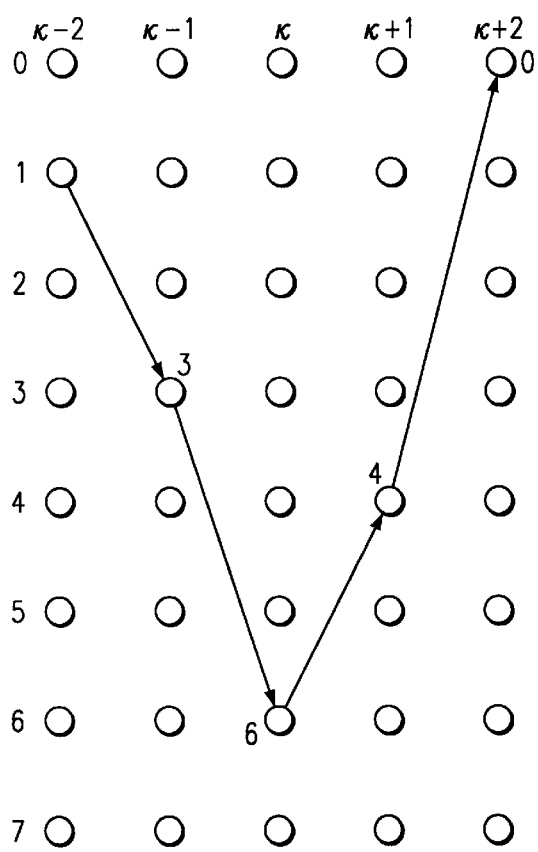
FIG. 3 illustrates a state transition diagram showing the history of state transitions from one channel code period to the next.
Figure 4A:
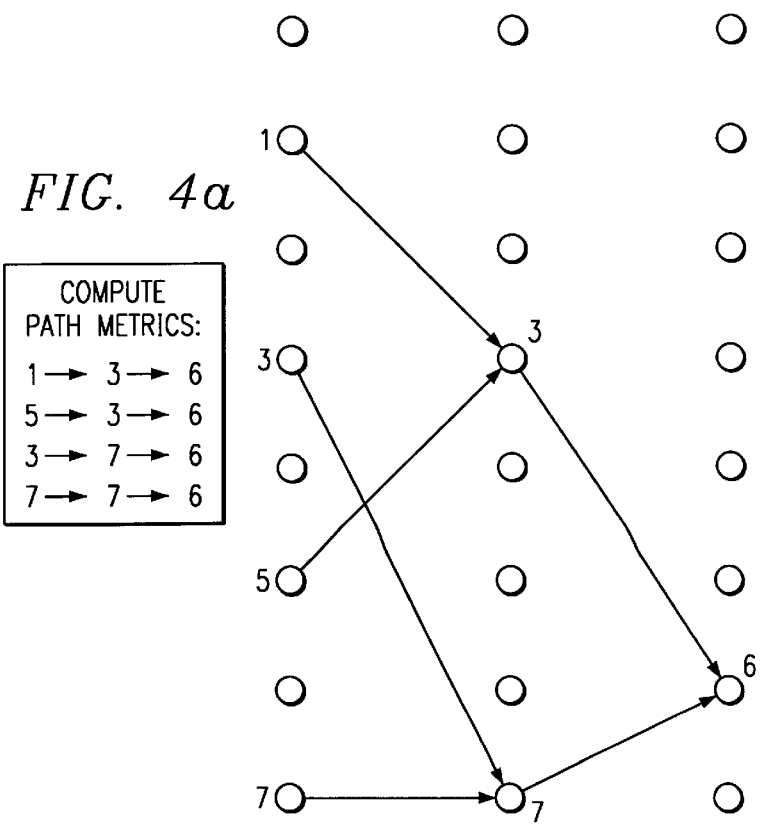
FIG. 4(a) illustrates a state transition diagram for a two-step approach that can be used in maximum likelihood sequence estimation.
Figure 4B:
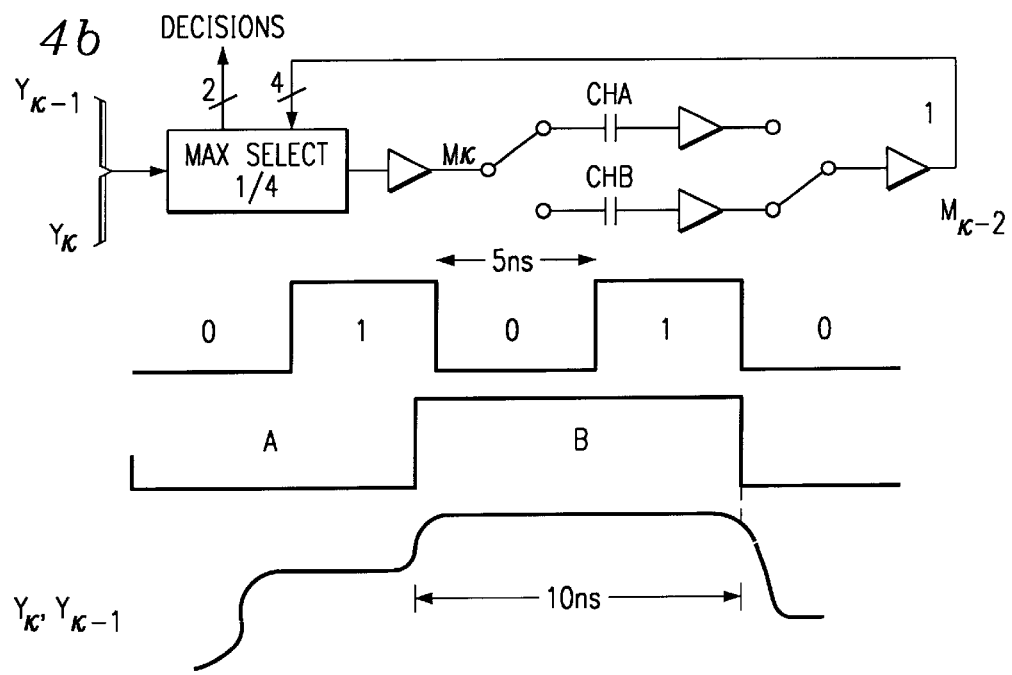
FIG 4(b) further illustrates the hardware and timing requirements for a two-step approach.
Figure 5:
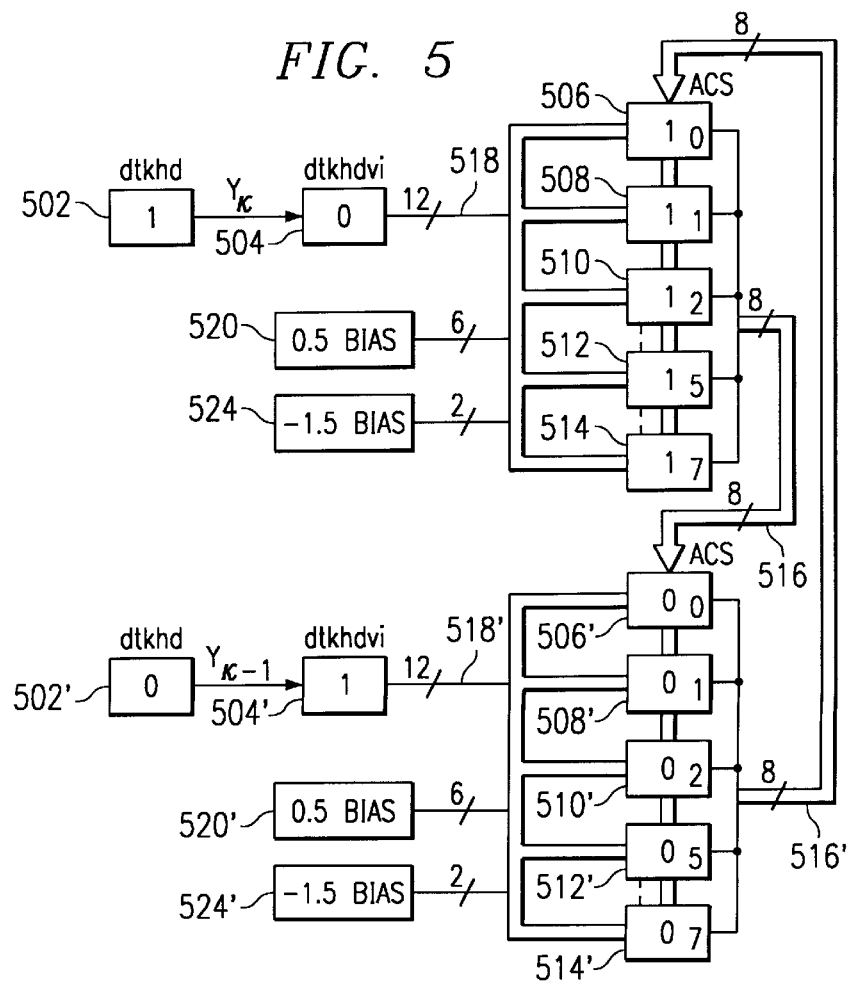
FIG. 5 illustrates a block diagram of a preferred embodiment of an interleaved detector according to the present invention.

FIG. 5 illustrates a block diagram of a preferred embodiment of an interleaved metric calculator according to the present invention. This interleaved architecture provides a metric calculator calculating and updating metrics and decisions at code rate, without requiring that all ACS computations be done in one code period, Tc. Instead, by doubling the number of circuits calculating metrics, the architecture allows 2Tc code periods for ACS units, and the speed required of the hardware is equivalent to the two-step approach discussed above with reference to FIGS. 4(a) and 4(b).

It will be appreciated by those of ordinary skill in the art that the metric calculator illustrated in FIG. 5 may be used in a larger read channel circuit used to read and decode data from a hard disk drive system. The calculator is typically used in a read channel in conjunction with a variable gain amplifier for receiving the read signal, as well as numerous other circuits such as filters, clock generators, and synchronizers.

The metric calculator illustrated in FIG. 5 is made up of an upper interleave and a lower interleave. The upper interleave is indicated by blocks 502, 504, and 506–514. The lower interleave is indicated by blocks 502', 504', and 506'–514'. Blocks 502 and 502' represent voltage samplers at opposite phases 1 and 0, respectively. These voltage samplers are also referred to in the art as differential track and hold, or dtkhd, circuits. Connected to blocks 502 and 502' are blocks 504 and 504', representing voltage-to-current converters for providing current proportional to the sampled channel signals. These elements are referred to in the art as differential track and hold voltage to current converters, or dtkhdvi. They are used in this embodiment of the present invention to permit all calculations to take place by use of positive and negative current values proportional to the sampled voltage input signal. Connected, in turn, to each of these voltage to current converters 504 and 504' are eight ACS units, represented by blocks 506–514 and 506'–514'. Each ACS unit calculates the metric for states 0 through 7, for alternating samples of the input signal, $y_k$, and $y_{k-1}$.

The outputs of upper interleave ACS units 506–514, each providing a metric value obtained for the previous code period, are selectively connected to the inputs of lower interleave ACS units 506'–514' according to the metric equations discussed above, so that calculation of subsequent metrics for each state can proceed. Similarly, the outputs of lower interleave ACS units 506'–514' are connected, as required, to the inputs of upper interleave ACS units 506–514 to perform subsequent metric calculations. To illustrate, the metric calculator 510' for state "2" needs to know the metrics for the previous code period of states "1" and "5," since $M_k(2) = \text{Max}\{M_{k-1}(1)+y_k, M_{k-1}(5)+0.5\}$. Therefore, the outputs of upper interleave ACS circuits 508 and 512, which have calculated the metric for the previous code period, are provided, through line 516, to lower interleave ACS circuit 510'. Similarly, metrics for state "1" and "5" calculated by the lower interleave ACS circuits 508' and 512' are provided as inputs to upper interleave ACS circuit 510, through line 516', so that the following metric for state "2" can be calculated.

As indicated at lines 518 and 518' in FIG. 5, each of the current converters 504 and 504' provides twelve outputs indicating a current proportional to the sampled voltage $y_k$ and $y_{k-1}$. These twelve outputs are necessary to carry out computations according to the metric equations discussed above for states 0 to 7, each equation requiring its own sample or samples of $y_k$. For example, the equation for $M_k(0)$ is $\text{Max}\{M_{k-1}(0)+0.5, M_{k-1}(4)-y_k\}$, and requires one negative $y_k$ term. Current converters 504 and 504' will therefore provide, through lines 518 and 518', a current value proportional to the negative value of the samples $y_k$ and $y_{k-1}$ to ACS blocks 506 and 506', respectively. Similarly, the equation for $M_k(1)$, $\text{Max}\{M_{k-1}(0)+y_k, M_{k-1}(4)+0.5\}$, requires one positive $y_k$ term. Therefore, blocks 508 and 508' receive a current value proportional to sample $y_k$ and $y_{k-1}$ respectively. To provide another example, lines 518 and 518' must each provide three current samples for $M_k(3)$ and $M_{k-1}(3)$, as given by $\{\text{Max}\{M_{k-1}(1)+2y_k-1.5, M_{k-1}(5)+y_k\}$. Altogether, twelve such $y_k$ current values are provided to the ACS circuits so that metric calculations for all states can proceed.

Also shown in FIG. 5 are bias generators 520 and 524, connected to the inputs of upper interleave ACS circuits 506–514. Bias generators 520' and 524' are connected to the inputs of lower interleave ACS circuits 506'–514'. These bias generators provide DC bias currents of 0.5 and –1.5, respectively, to allow the metric equations discussed above to proceed. For example, the bias current 0.5 is provided to ACS circuits 506 and 506' to determine $M_k(0) = \text{Max}\{M_{k-1}(0)+0.5, M_{k-1}(4)-y_k\}$. There are six "0.5" terms and two "–1.5" terms.

Those skilled in the art will appreciate that a common mode feedback device (not shown) is typically connected to ACS circuits 506–514 and 506'–514'. Such a feedback device will prevent metric values from continually growing beyond the dynamic range of the circuit. The feedback device will, for example, add up metrics from states "0" through "7," divide the result by eight, and subtract the calculated average from each metric value in each ACS circuit.

In operation, blocks 506–514 and 506'–514' alternately calculate metrics for eight possible states in a given signal channel. The upper interleave is provided data $y_k$ by the upper differential track and hold circuit 502. As indicated by the "1" on circuit 502, circuit 502 is in tracking (sampling) mode during phase "1" and holding mode during phase "0." As indicated by the "0" on the upper voltage to current converter 504, converter 504 is updated by circuit 502 during phase "0" and holds its value during phase "1." The lower interleave is provided data $y_{k-1}$ by lower different track and hold circuit circuit 502'. As indicated by the "0" on circuit 502', circuit 502' is in tracking (sampling) mode during phase "0" and holding mode during phase "1." As indicated by the "1" on the lower voltage to current converter 504', this converter is updated by circuit 502' during phase "1" and holds its value during phase "0."

Thus, the top interleave in FIG. 5 calculates metrics using $y_k$ samples obtained during clock phase "1," and held during phase "0." The bottom interleave calculates metrics using $y_{k-1}$ samples obtained one period later, during clock phase "0," and held during phase "1." The value of the sample $y_k$ received from sampler 502 updates differential track and hold circuit 504. Circuit 504 then holds this value during phase "1" for continued use by ACS circuits 506–514. Similarly, the value of the sample $y_{k-1}$ received from sampler 502' updates differential track and hold circuit 504' during phase "1." Circuit 504' then holds this value during phase "0" for continued use by ACS circuits 506'–514'. As will be explained below with reference to FIGS. 6(a) and 6(b), this arrangement of sampling and holding input values at opposite phases works in tandem with tracking and holding of metrics calculated during opposite phases by ACS circuits 506–514 and 506'–514' to allow interleaved calculation of metrics.

Figure 6A:
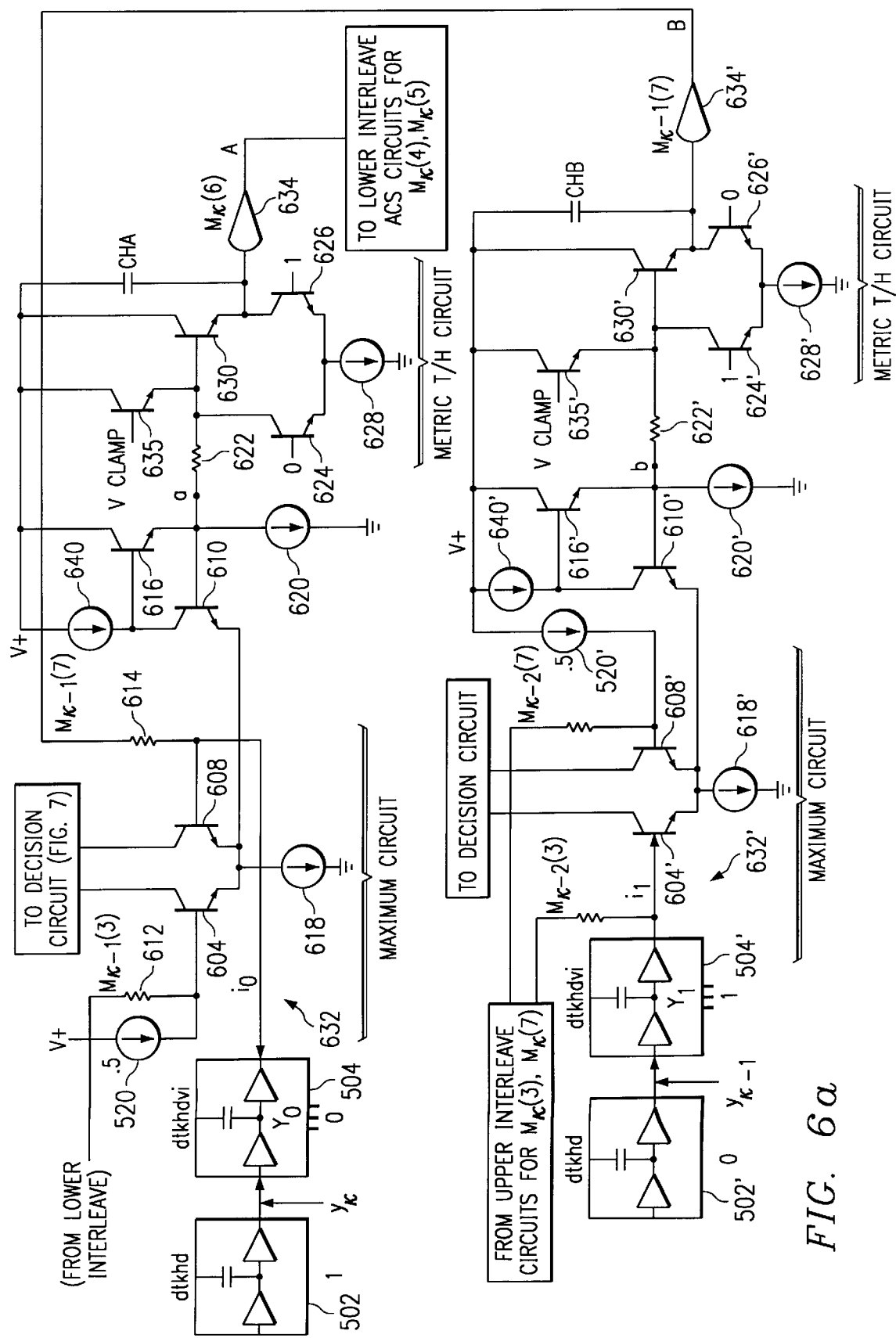
FIGS. 6(a) and 6(b) illustrate the circuit configuration and timing diagram of a preferred embodiment of the present invention.
Figure 6B:
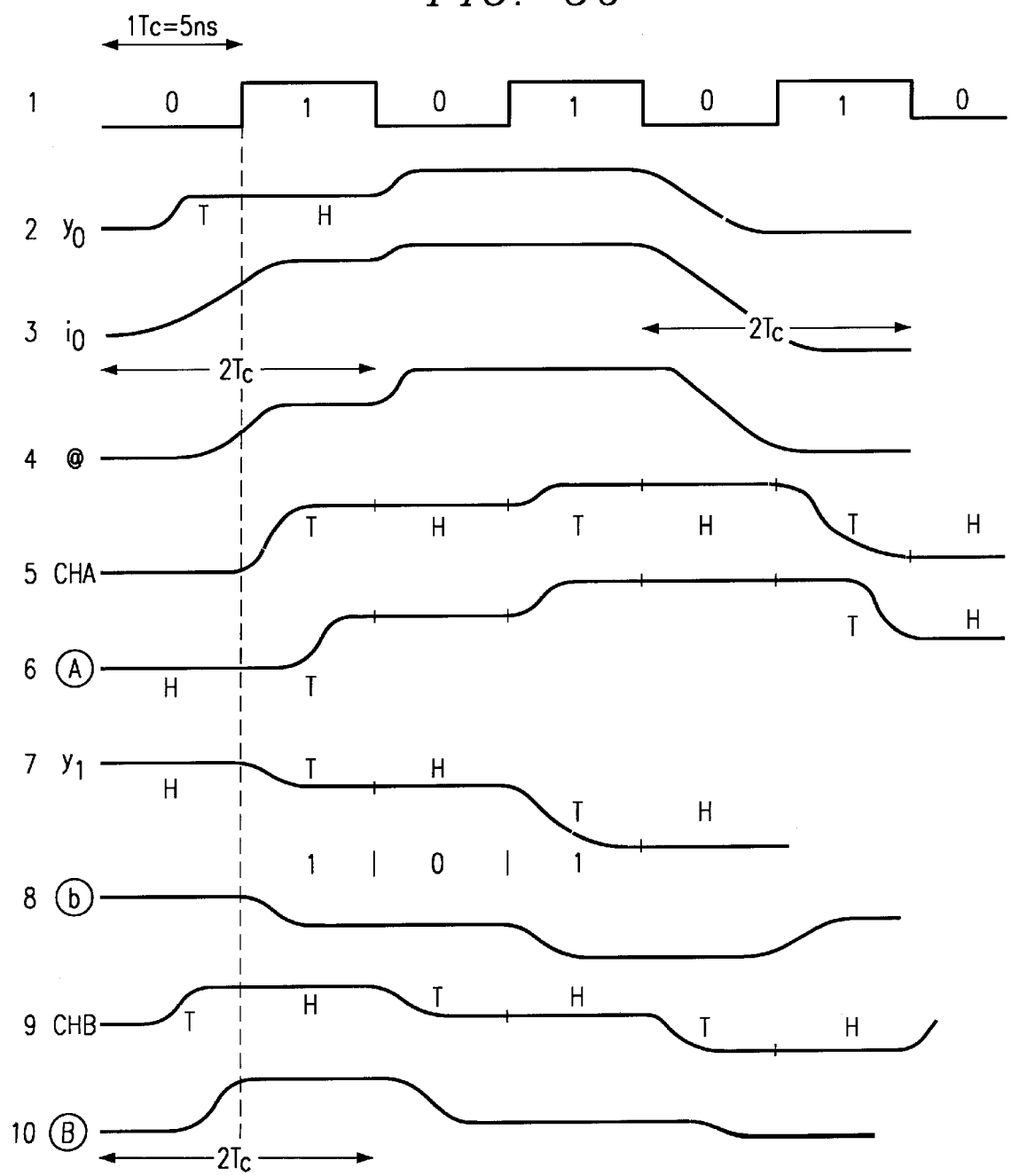

FIGS. 6(a) and 6(b) illustrate the circuit configuration and timing diagram of the preferred embodiment of the present invention discussed above generally with reference to FIG. 5. FIG. 6(a) illustrates two ACS circuits from FIG. 5, one from the upper interleave and another from the lower interleave. These circuits will be explained by first identifying the elements in the upper interleave portion of FIG. 6(a), then identifying the timelines in FIG. 6(b), and then describing the operation of FIG. 6(a) with reference to the timelines in FIG. 6(b).

FIG. 6(a) illustrates a circuit implementation of the ACS units shown in FIG. 5 for computing the metric for state "6." Element 632, connected to voltage sampler 502 and voltage to current converter 504, from FIG. 5, is a single ACS circuit for the state "6" in the upper interleave of FIG. 5. Element 632', connected to voltage sampler 502' and voltage to current converter 504', is a single ACS circuit for the state "7," in the lower interleave of FIG. 5. Generally, as shown in FIG. 6(a), each ACS circuit includes a maximum circuit and a metric track and hold (T/H) circuit. Using previous metrics calculated by maximum circuits of the lower interleave, the maximum circuits of the upper interleave begin calculating the metric for one of states "0" through "7" during a first phase of a clock, and complete this process during a second phase to reach a final metric value. The metric track and hold circuits for the upper interleave receive the final metric value during the second phase of the clock, and hold this value during a third phase of the clock so it can be used by the lower interleaves to calculate subsequent metrics for states "0" through "7".

ACS circuit 632 connects to voltage to current converter 504 through the base of transistor 608, which is connected by its emitter to the emitter of transistor 604 to form a maximum circuit. Also coupled to the base of transistor 608 is resistor 614, which is coupled at its other end to the ACS circuit for state "7" in the lower interleave circuit to receive $M_{k-1}(7)$. The base of transistor 604, on the other side of the comparator, is connected to resistor 612. Resistor 612, at its other end, will receive the metric for state "3," $M_{k-1}(3)$, from the bottom interleave. The base of transistor 604 is also connected to a bias current from bias current generator 520. Bias current generator 520 is in turn connected at its other end to supply voltage V+. The emitters of transistors 604 and 608 are both connected to current source 618, which is connected at its other end to ground. Also connected to the emitter of transistors 604 and 608 is the emitter of a third transistor, 610. The collectors of transistors 604 and 608 are connected to a decision circuit, which will be discussed below with reference to FIG. 7. The collector of transistor 610 is connected to a current source 640, in turn connected to supply voltage V+. The base of a fourth transistor 616 is connected to the collector of transistor 610. The collector of transistor 616 is connected to V+, and its emitter is connected to the base of transistor 610, as well as to current source 620, which is in turn connected to ground.

A resistor 622 is connected to the emitter of transistor 616, and is connected at its other end to the collector of transistor 624, and the base of transistor 630. The emitter of transistor 624 is connected to another transistor 626, and both emitters are connected to ground through a current source 628. The collector of transistor 626 is connected to the emitter of transistor 630, which is, in turn, connected at its collector to the power supply, V+. Transistor 635 is connected at its base to a clamp voltage, at its collector to V+ and at its emitter to the base of transistor 630. A holding capacitor, CHA, is connected at one end to V+, and at the other end to the emitter of transistor 630 and to the input of a buffer 634. The output of buffer 634 provides the metric $M_k(6)$, which is used by ACS circuits for states "4" and "5" in the lower interleave.

As can be appreciated from comparison of the upper and lower circuits in FIG. 6(a), the ACS circuits for $M_k(6)$ and $M_{k-1}(7)$ are very similar. One difference, due to their being on different interleaves, is that they are designed to sample and hold at opposite times, both at their input sampling stages and in their metric track and hold circuits. Other differences are due to the differences between required metric calculations for $M_k(6)$ and $M_{k-1}(7)$. For example, $M_k(6)$ requires a negative $y_k$ term added at the base of transistor 608, while $M_{k-1}(7)$ requires a positive $y_k$ term added at the base of transistor 604'. Similarly, a 0.5 current bias must be added to the base of transistor 608', whereas the upper interleave required this bias for transistor 604. Because ACS circuits operate based on the same principles and are the same except for these noted differences, an explanation will be provided below only for the operation of ACS circuit 632 in the upper interleave of FIG. 6(a).

ACS circuit 632 has two parts, a maximum circuit, and a metric track and hold circuit. The operation of these circuits can be best understood with reference to the timing diagrams, labeled 1–10, in FIG. 6(b). Line 1 on FIG. 6(b) represents a clock signal whose period equals twice the code period, Tc. In this example, the frequency of the clock is 100 Mhz, so there are ten nanoseconds in each clock period and five nanoseconds in each code period, Tc, of phase "0" or "1." On line 2 there is a diagram illustrating the signal $y_0$, representing the output of voltage sampler 502 as sampled by voltage to current converter 504 during phase "0," and held during phase "1." On line 3, a diagram illustrates current $i_0$, the output of voltage to current converter 504 updated during each phase "0." The diagram on line 4 illustrates the metric value building at node "a," in upper interleave ACS circuit 632. Next, line 5 illustrates the metric value stored on capacitor CHA in upper interleave ACS circuit 632. The update of this metric value is initiated at the beginning of phase "1" when a metric track and hold circuit is activated to transfer voltage at node "a" to CHA. The following diagram on line 6 illustrates the final metric value, A, received at the output of buffer 634. Continuing down the figure, the next diagram on line 7 illustrates $y_1$ the voltage sampled by sampling circuit 502' as sampled by the voltage to current converter 504' during phase "1," and held during phase "0." The diagram on line 8 illustrates the voltage at node "b" in the lower interleave. The voltage in capacitor CHB is shown by line 9. The final metric value at node B, at the output of buffer 634', is shown on line 10.

Voltage sampler 502 samples the input signal during phase "1," and holds in phase "0" during which voltage to current converter 504, that provides the current used by ACS circuit 632, is updated. As shown in FIG. 6(b) at line 3, current $i_0$ begins to ramp up during phase "0." The maximum circuit of ACS unit 632 includes transistor pair 604 and 608 for calculating $M_k(6)=\text{Max}\{M_{k-1}(3)+0.5, M_{k-1}(7) -y_k\}$. Specifically, the base of transistor 604 receives constant DC current of 0.5. It also receives a voltage representing $M_{k-1}(3)$ through resistor 612. Thus, at the base of transistor 604, the voltage formed is $M_{k-1}(3)+0.5$. At the base of transistor 608, a voltage representing the previous metric $M_{k-1}(7)$, from the lower interleave, is provided through to the top end of resistor 614. Added to this current is a current proportional to $-y_k$, to provide a voltage corresponding to $M_{k-1}(7)-y_k$.

As voltage to current converter 504 begins to convert voltage $y_k$ into current $i_0$, and the previous metrics for states "3" and "7" begin to impress themselves through resistors 612 and 614, the Add/Compare/Select functions of the ACS circuit are initiated simultaneously. With the circuit still operating during phase "0," as the voltages develop at the bases of transistors 604 and 608, the larger value will dominate, and will begin to develop at node "a." Transistors 610 and 616, together with either of transistors 604 or 608, whichever dominates during operation, provide a unity gain buffer that transfers the larger of the two values at the bases of transistors 604 and 608 to node "a" during phase "0." This effect is shown by the diagram on line 4 in FIG. 6(b) which shows the voltage "a" ramping up during phase "0," and continuing into phase "1".

At the end of phase "0," the metric $M_k$ is substantially acquired, but not necessarily fully accurate, at node "a." Stated differently, $M_k$ may be very close to its final value, but may not have had enough time during phase "0" to reach its final value. If metrics in this circuit were required to be calculated during a single code period, this failure to reach a final value would be unacceptable and might lead to errors in data detection. However, as explained below, the interleaved configuration of FIG. 6(a) allows the final value to be reached by the end of the subsequent phase "1."

The circuit of FIG. 6(a) provides increased time to achieve a final value because of two features. The first feature is that voltage to current converter 504 continues to hold the sampled value of the input, $i_0$, during phase "1." This feature is illustrated in FIG. 6(b), line 3, by the straight horizontal sections defining current $i_0$, during the latter part of each period in phase "1." Because the sampled input value is held, it is available for transistors 604, 608 and 610 to continue their compare and select functions.

The second feature allowing the circuit more time to reach a final metric value is that track and hold circuits in each ACS circuit hold their previous metric values during the phase subsequent to the one in which they were updated. This feature is illustrated in FIG. 6(b), lines 5 and 6. Specifically, metric "A," representing $M_k(6)$, is updated during clock phases "1," following the turning on of transistor 626, to transfer the voltage at node "a" to capacitor CHA. But, as indicated by the horizontal sections of the diagram in FIG. 6(b), line 6 during this time, A can be used to initiate the metric update in the lower interleave. And since the metric value for A settles and holds during "0" it can be used by bottom interleave ACS circuits during phase "0" to complete the lower interleave metrics update as shown in "b" & CHB in FIG. 6(b).

As illustrated in FIG. 6(b), lines 4 and 5, when phase "1" begins, the metric value continuing to build at node "a" is allowed to start transferring to capacitor CHA. It is then necessary that the updated metric be fully captured on to CHA by the end of phase "1". Thus, there are essentially 2Tc periods available to acquire the new metric on to CHA, so long as the voltage from node "a" is transferred quickly enough to capacitor CHA, such that it is not the speed limiting bottleneck of the circuit.

As further illustrated in FIG. 6(b), line 6, with the configuration of the circuit shown in FIG. 6(a), as the new metric begins to assert itself at CHA it is immediately used, via the buffer with its output at node A, in the computation of the next metric update in the lower interleave. Again, it is not necessary for the computation to be complete and accurate by the end of the phase "1". All it has to do is to reach a value such that at the end of the next phase "0," during which an upper interleave capacitor is holding a metric value, a new metric is fully captured on the holding capacitor of the lower interleave, such as capacitor CHB. Holding is accomplished by steering current 628 (628') through transistor 624 (624') to develop a voltage drop through resistor 622 (622') to clamp the base of transistor 630 (630'), such that transistor 630 (630') is turned off.

Unlike prior art ACS circuits that first compared two metric values and then selected the most-likely correct or largest one, the select process of the circuit of FIG. 6(a) does not need to await the completion of the compare process. These processes occur, by the very nature of the ACS realization discussed here, simultaneously. Thus, if two metrics are very close, the resulting metric update would be in error due to the fact that both 604 and 608 conduct current (Vbe error). However, the error associated with the Vbe error can be ignored by properly scaling metric swings such that Vbe errors are negligible compared to the metric swings.

Figure 7:
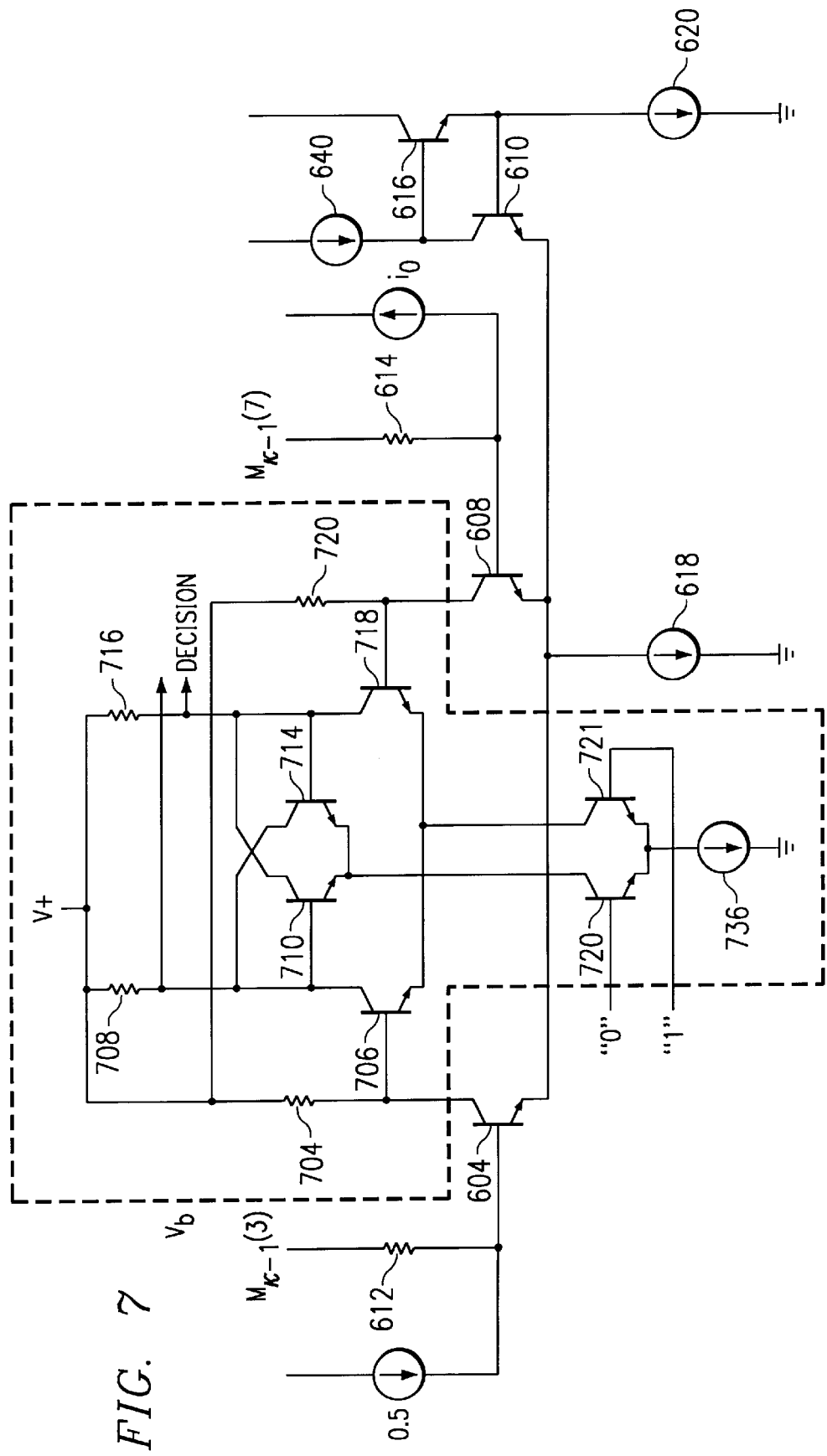
FIG. 7 illustrates a latching circuit used in a detector according to a preferred embodiment of the present invention.

FIG. 7 illustrates a circuit that may be used according to a preferred embodiment to latch a decision from the circuit shown in FIG. 6. Thus far, the description of FIGS. 5, 6(a), and 6(b) has concerned calculation of metrics by using two previous metrics, required constants 0.5 and −1.5, and the sampled input voltage $y_k$. But data sequence detection requires in addition that a sequence detector keep track of which of the compared metrics was larger. More specifically, a survival path register must be fed with decisions obtained after each comparison of metrics, as indicated by the metric equations discussed earlier, to provide the likely value of the data $I_{k-3}$, three code periods prior to the current period, k.

In FIG. 7, the clocking scheme is for the top interleave in FIG. 6(a), and transistors 604, 608, 610, 616, and 640 are as indicated in FIG. 6(a). As shown by the dotted lines in FIG. 7, transistor pairs 706 and 718, 710 and 714, and 720 and 721, along with biasing resistors 708, 716, 704, and 720, and current source 736, constitute a decision circuit connected to the collectors of transistors 604 and 608. More specifically, a resistor 704 is connected at one end to V+, and at the other end to the collector of transistor 604. Similarly, a resistor 720 is connected at one end to V+, and at the other end to the collector of transistor 608. Emitter-connected transistors 706 and 718 are connected at their bases to the collectors of transistors 604 and 608, respectively. The collectors of transistors 706 and 718 are, in turn, connected to bases of emitter-connected transistors 710 and 714. The emitters of these transistors are connected to a latching circuit using emitter-connected transistor pair 720 and 721, whose emitters are coupled to ground by a current source 736, and whose bases are controlled by clock phases "0" and "1," respectively. The collectors of transistor 710 and 714 are cross-connected to biasing resistors 708 and 716, which are connected on the other side to V+. A differential output representing a decision regarding $I_{k-3}$ is provided across resistors 708 and 716, and fed to a survival path register.

During operation, data associated with $I_{k-3}$, or the first bit of the previous state is decoded in the decision circuit of FIG. 7, just as transistors 604 and 608 are performing their comparison and selection of the largest value in a metric equation. For example, during computation of $M_k(0)$, it is necessary to determine which of $(M_{k-1}(0)+0.5)$ or $(M_{k-1}(4)-y_k)$ is larger. If the latter is larger, then the first bit "1" associated with the state "4" or 100 is stored and the decision in FIG. 7 across resistors 708 and 716 is "1." Conversely, if the former value is larger, then the first bit "0" associated with state 000 would be stored, and the decision output differentially across resistors 708 and 716 would be "0." Each time a metric calculation is performed by transistors 604 and 608, and the metric value has reached its final value, a decision is provided by transistor pair 706 and 718. In the case of the ACS circuit 632 in the upper interleave of FIG. 6(a), a decision is latched during phase "0" by transistor 720, and released during phase "1" by transistor 721. As is known in the art, a survival path register keeps track of these decisions to make the final determination regarding the value $I_{k-3}$, based on the stored decisions from each state for a number of periods.

The foregoing description illustrates a preferred embodiment of an interleaving architecture that allows two code periods for ACS computations by doubling the hardware used to perform computations. The hardware complexity of this interleaved approach is comparable to the two-step approach described with reference to FIGS. 4(a) and 4(b) above, but the accuracy required of computations with this approach is much more relaxed.

Preferred embodiments of the present invention can provide significant advantages of speed, and operate at greater than 200 Mbps with 0.8 u BICMOS technology. They can reduce signal processing speed requirements to one half of a non-interleaved architecture and provide very close to ideal performance, utilizing the inherent matching properties of, first and foremost, NPN transistors and other components available in BICMOS technology. These embodiments can also advantageously provide accurate and full (not simplified) 8 state EPR4 Viterbi calculation in BICMOS technology beyond 200 Mbps.

Having described a preferred circuit configuration embodying the invention, those skilled in the art will appreciate that various modifications may be made of the invention without departing from its spirit. Therefore, it is not intended that the scope of this invention be limited to the specific embodiments illustrated and described herein. Rather, it is intended that the scope of the invention be determined by the appended claims and their equivalents.

What is claimed is:

1. In a read channel device, an interleaved metric calculator providing a set of decisions at a code rate to a survival register for maximum likelihood detection of a binary signal sequence recorded on a medium and detected through a channel characterized by a set of multi-bit sequences defining possible channel states, signals in said signal sequence having a code period inversely proportional to the code rate, said decisions being based on a pair of metrics calculated for each state, comprising:

(a) a first set of circuits approximately calculating metric values for at least some channel states during a first code period and completing calculation of these metric values during a second code period subsequent to the first code period, using, in part, a first sample of the recorded signal, initially received by the first set of circuits during the first code period and continued to be received during the second code period;

(b) a second set of circuits approximately calculating metric values for at least some channel states during the second code period and completing calculation of these metric values during a third code period subsequent to the second code period, using, in part, a second sample of the recorded signal, initially received by the second set of circuits during the second code period and continued to be received during the third code period;

(c) a third set of circuits acquiring the metric values calculated by the first set of circuits during the second code period, making them immediately available to the second set of circuits, and holding these values during the third code period; and (d) a fourth set of circuits acquiring the metric values calculated by the second set of circuits during the third code period, making them immediately available to the first set of circuits, and holding these values during a fourth code period subsequent to the third code period.

2. The metric calculator of claim 1, wherein:
said first set of circuits perform metric calculations using at least said first sample of the recorded signal by algebraically changing said metric values made available by said fourth set of circuits.

3. The metric calculator of claim 2, wherein:
said second set of circuits perform metric calculations using at least said second sample of the recorded signal by algebraically changing said metric values made available by said third set of circuits.

4. The metric calculator of claim 2, wherein:
said algebraic changing of metric values includes performing at least one of addition and subtraction operations on the metric values made available by said fourth set of circuits using said second sample of the recorded signal and at least one reference value.

5. The metric calculator of claim 4, wherein:
said algebraic changing of metric values includes performing at least one of addition and subtraction operations on these metric values using said second sample of the recorded signal and at least one reference value.

6. The metric calculator of claim 2, wherein:
said first and second sets of circuits provide decisions to a survival register by comparing pairs of metric values computed.

7. The metric calculator of claim 4, wherein:
said decisions provided by said first set of circuits indicate whether a first bit in a multi-bit sequence defining a previous channel state was a one or a zero.

8. In a read channel device, a method of providing a set of decisions at a code rate to a survival register for maximum likelihood detection of a binary signal sequence recorded on a medium and detected through a channel characterized by a set of multi-bit sequences defining possible channel states, signals in said signal sequence having a code period inversely proportional to the code rate, said decisions being based on a pair of metrics calculated for each state, comprising the steps of:

(a) approximately calculating a first set of metric values using a first circuit for a least some channel states during a first code period and completing calculation of the first set of metric values during a second code period subsequent to the first code period, using, in part, a first sample of the recorded signal received during the first code period and held during the second code period;

(b) approximately calculating a second set of metric values using a second circuit for said at least some channel states during the second code period and completing calculation of the second set of metric values during a third code period subsequent to the second code period, using, in part, a second sample of the recorded signal received during the second code period and held during the third code period;

(c) acquiring the first set of metric values from the first circuit during the second code period, making them immediately available to the second circuit, and holding these values during the third code period; and (d) acquiring the second set of metric values from the second circuit during the third code period, making them immediately available to the first circuit, and holding these values during a fourth code period subsequent to the third code period.

9. The method of claim 8, wherein:
said step of calculating the first set of metric values comprises algebraically changing metric values made available from said second circuit using at least said first sample of the recorded signal.

10. The method of claim 8, wherein:
said step of calculating the second set of metric values comprises algebraically changing metric values made available from said first circuit using at least said second sample of the recorded signal.

11. The method of claim 9, wherein:
said algebraic changing of metric values made available from said second circuit includes performing at least one of addition and subtraction operations on these metric values using said first sample of the recorded signal and at least one reference value.

12. The metric calculator of claim 10, wherein:
said algebraic changing of metric values made available from said first circuit includes performing at least one of addition and subtraction operations on these metric values using said second sample of the recorded signal and at least one reference value.

13. The method of claim 9, further comprising the step of:
providing decisions to the survival register based on a comparison of metric values computed.

14. The method of claim 13, wherein:
said decisions provided to the survival register indicate whether a first bit in a multi-bit sequence defining a previous channel state was a one or a zero.

15. An interleaved metric calculator comprising:
(a) a first circuit calculating a first set of metric values during a first time period and also during at least a portion of a second time period following the first time period, using at least a first sample of a recorded signal initially received during said first time period, and continued to be received during the second time period;
(b) a second circuit calculating a second set of metric values during the second time period and also during at least a portion of a third time period following the second time period using at least a second sample of the recorded signal initially received during the second time period, and continued to be received by the second circuit during the third time period;
(c) a third circuit that obtains the calculated metric values from the first circuit during the second time period and holds them during the third time period; and
(d) a fourth circuit that obtains the calculated metric values from the second circuit during the third time period and holds them during a fourth time period following the third time period, wherein:
the calculation performed by said first circuit provides approximate metric values by the end of the first time period, and provides completely accurate metric values by the end of the second time period, and the calculation performed by said second circuit provides approximate metric values by the end of the second time period, and provides more accurate metric values during the third time period.

16. An interleaved metric calculator comprising:
(a) a first circuit calculating a first set of metric values during a first time period and also during at least a portion of a second time period following the first time period, using at least a first sample of a recorded signal initially received during said first time period, and continued to be received during the second time period;
(b) a second circuit calculating a second set of metric values during the second time period and also during at least a portion of a third time period following the second time period using at least a second sample of the recorded signal initially received during the second time period, and continued to be received by the second circuit during the third time period;
(c) a third circuit that obtains the calculated metric values from the first circuit during the second time period and holds them during the third time period; and
(d) a fourth circuit that obtains the calculated metric values from the second circuit during the third time period and holds them during a fourth time period following the third time period, wherein:
said third circuit immediately provides the calculated metric values from the first circuit to the second circuit after it obtains them, and said second circuit algebraically changes these calculated metric values using at least the second sample of the recorded signal to calculate the second set of metric values.

17. In a read channel device, an interleaved metric calculator providing a set of decisions at a code rate to a survival register for maximum likelihood detection of a binary signal sequence recorded on a medium and detected through a channel characterized by a set of multi-bit sequences defining possible channel states, signals in said signal sequence having a code period inversely proportional to the code rate, said decisions being based on a pair of metrics calculated for each state, comprising:
(a) a first interleave circuit comprising a first set of ACS circuits and a first track and hold circuit, said first set of ACS circuits approximately calculating metric values for at least some channel states during a first code period and completing calculation of these metric values during a second code period subsequent to the first code period, using, in part, a first sample of the recorded signal, held during the first code period to update the first track and hold circuit, said first sample being provided to the first set of ACS circuits beginning during the first code period and being held during the second code period;
(b) a second interleave circuit comprising a second set of ACS circuits and a second track and hold circuit, said second set of ACS circuits approximately calculating metric values for at least some channel states during the second code period and completing calculation of these metric values during a third code period subsequent to the second code period, using, in part, a second sample of the recorded signal, held during the second period to update the second track and hold circuit, said second sample being provided to the second set of ACS circuits beginning during the second code period and being held by the second track and hold circuit during the third code period;
(c) a third set of circuits acquiring the metric values calculated by the first set of ACS circuits during the second code period, making them immediately available to the second set of circuits, and holding these values during the third code period; and
(d) a fourth set of circuits acquiring the metric values calculated by the second set of ACS circuits during the third code period, making them immediately available to the first set of circuits, and holding these values during a fourth code period subsequent to the third code period.

* * * * *